United States Patent
Uludag

(10) Patent No.: US 9,614,546 B2
(45) Date of Patent: Apr. 4, 2017

(54) DATA COMPRESSION AND DECOMPRESSION METHOD

(71) Applicant: ARMOYA YUKSEK TEKNOLOJI ARASTIRMALARI ELEKTRONIK SANAYI VE TICARET ANONIM SIRKETI, Istanbul (TR)

(72) Inventor: Tuncay Uludag, Istanbul (TR)

(73) Assignee: ARMOYA YUKSEK TEKNOLOJI ARASTIRMALARI ELEKTRONIK SANAYI VE TICARET ANONIM SIRKETI, Istanbul (TR)

( * ) Notice: Subject to any disclaimer, the term of this patent is extended or adjusted under 35 U.S.C. 154(b) by 0 days.

(21) Appl. No.: 14/833,146

(22) Filed: Aug. 24, 2015

(65) Prior Publication Data

US 2017/0041023 A1    Feb. 9, 2017

(30) Foreign Application Priority Data

Aug. 9, 2015 (TR) .............................. a 2015 09829

(51) Int. Cl.
 H03M 7/40    (2006.01)
 H03M 7/30    (2006.01)

(52) U.S. Cl.
 CPC .......... *H03M 7/6058* (2013.01); *H03M 7/40* (2013.01); *H03M 7/4031* (2013.01)

(58) Field of Classification Search
 CPC ......... H04N 19/13; H04N 19/91; H03M 7/40; H03M 7/46; H03M 5/145; H03M 7/42; H03M 7/4006; H03M 7/425; H03M 7/30; H03M 7/3086; H03M 7/3088; H03M 7/4075; H03M 7/607; H03M 7/3053; H03M 7/3084

USPC ...................................... 341/65, 67, 106, 107
 See application file for complete search history.

(56) References Cited

U.S. PATENT DOCUMENTS

| | | | | |
|---|---|---|---|---|
| 5,402,123 A * | 3/1995 | Jung | ....................... | H03M 7/42 341/63 |
| 5,650,783 A * | 7/1997 | Murashita | ........... | H03M 7/4006 341/107 |
| 5,684,829 A * | 11/1997 | Kizuki | ................. | H04B 14/046 341/64 |
| 5,835,033 A * | 11/1998 | Mita | ....................... | H03M 7/46 341/63 |
| 5,914,680 A * | 6/1999 | Murashita | ............... | H03M 7/42 341/106 |

(Continued)

*Primary Examiner* — Linh Nguyen
(74) *Attorney, Agent, or Firm* — Gokalp Bayramoglu

(57) ABSTRACT

A data compression and decompression algorithm performing the function of data compression and decompression by using the steps of: dividing a main data stream into sub data streams, calculating frequency of occurrence of sub data streams in the main data stream, repeating the process of calculating frequency of occurrence by changing the number of digits in sub data stream and by changing the starting digit position in main data stream, assigning codes to sub data streams based on their frequency occurrence values, calculating group dimension index for each group, selecting the group with the lowest group dimension index and placing codes of the group with the lowest group dimension index in a multi dimensional space wherein vector placement is utilized to eliminate the need to use digits that are common to neighboring codes therefore providing an additional compression.

9 Claims, 6 Drawing Sheets

(56) References Cited

U.S. PATENT DOCUMENTS

| | | | | |
|---|---|---|---|---|
| 6,011,496 A | * | 1/2000 | Park | G10L 19/005 |
| | | | | 341/55 |
| 6,026,198 A | * | 2/2000 | Okada | G06T 9/005 |
| | | | | 341/107 |
| 7,205,911 B2 | * | 4/2007 | Kim | H04L 25/4908 |
| | | | | 341/58 |
| 2006/0176196 A1 | * | 8/2006 | Sugita | H03M 7/40 |
| | | | | 341/60 |
| 2010/0309031 A1 | * | 12/2010 | Kawato | H01J 49/0036 |
| | | | | 341/87 |
| 2015/0002320 A1 | * | 1/2015 | Kataoka | G06F 5/00 |
| | | | | 341/65 |

* cited by examiner

DATA COMPRESSION AND DECOMPRESSION METHOD

FIELD OF THE INVENTION

This invention is related to data compression and decompression methods. The method can be applied to any data that can be used in computers; electronic devices, communication devices, databases, data storage, data transfer devices/systems, and any device or system that stores, processes, transfers or uses digital data. Data compression can be accomplished either with or without the loss of original data. The method provides higher data compression rate and enables a computer system to perform data compression in a faster and more efficient way.

BACKGROUND

Data compression has recently become a very important topic due to the increasing need of data communication. The increase in data communication requires massive amounts of data to be stored or communicated between systems. Data compression techniques are therefore required to reduce the communication time and reduce the storage requirements in a system.

Data compression and data transfer techniques are used to compress data for storage and communication in any field where data transfer or storage places a premium on speed and storage efficiency. Modern applications for data compression include but is not limited with the fields of voice, picture, video, and encryption applications. Since we have moved from the Analog to the Digital age, data compression and decompression is being used in cable and wireless data communications, general communications, encrypted data storage, and encrypted communication to compress and decompress data.

As early as 1836, Samuel Morse invented the Morse code, which is a communication coding system where the letters of the alphabet are represented by binary codes, digits of which consist of dots and dashes. Morse code is considered to be one of the fundamentals of today's data compression theories. As an example, the letter "E" which is the most frequently used vowel in English is represented with a single dot whereas the letter "T" which is the most frequently used consonant in English is represented with a single dash.

Data compression studies continued into the twentieth century when Professor Claude Shannon and Robert Fano published an article in 1948 entitled "A mathematical Communication Theory", disclosing a data compression mathematical algorithm known as the Shannon-Fano technique.

The second half of the twentieth century saw leaps in data compression, in each decade. In 1952, David A. Huffman started exploring the data compression field as a Ph.D. student at the Massachusetts Institute of Technology (MIT). Huffman eventually described his data compression method in an article published in 1952. Huffman's method forms the basis for lossless data compression by using entropy coding. In this method, data elements used in a data chain are statistically counted. Then, the data chains are replaced by codes that are assigned to data elements by frequency of repetition. In other words, those parts in the data chain that repeat the most are represented by shorter codes while those parts that seldom repeat are represented by longer codes. These shorter and longer codes are combined together to produce a code, which is shorter than the original data string and can be converted back to the original data string.

As time progressed, data compression algorithms moved from using specialized hardware to being more general purposed. By the late 1970s most files stored within a network were stored using data compression algorithms that employed Huffman coding. However, another advance in data compression occurred when Lempel and Jakob Ziv disclosed visual based coding in 1977. The algorithm developed by Lempel and Jakob Ziv is called "LZW", and the LZW algorithm was used in most general-purpose data compression applications. This technique is still used in data compression applications such as PKZIP and other modern applications.

By the end of the 1980's, several data compression standards for digital video existed. In the early 1990's, video data compression algorithms existed, but with low resolution and/or low color fidelity. The lower resolution and lower color fidelity was a result of losing part of the data chain during compression. Some examples of the current video compression algorithms are listed as: 1) FAX CCITT 3 which uses Huffman coding; 2) GIF (LZW) and JPEG which use Cosine Transformation (which results in data loss and is complemented by Huffman or arithmetic coding); 3) BMP which uses working length coding; and 4) TIFF algorithms that are used in black and white fax facsimile machines.

Presently, data compression for a given application can be accomplished either by using known methods by themselves or by combining methods via cascading of various methods. When used alone, a data compression method has to be applied to a specific field in order to produce the best results. For example, a data compression method that may be optimum for storage files may not be a good method for audio compression. Likewise a data compression method that produces satisfactory data compression results for video data may not be suitable for compressing storage files. Different data compression methods are usually used in combination and repeatedly for different applications to increase the efficiency of data compression and to ensure optimum compression across a variety of fields of technology.

SUMMARY

The method is a data compression and decompression method, comprising: dividing a main data string into a plurality of sub data strings; calculating a plurality of frequency of occurrences for the plurality of sub data strings in the main data string; assigning a code to each sub data string within the plurality of sub data systems wherein the sub data string with the highest frequency of occurrence is assigned a code having the least number of digits and the sub data string having the lowest frequency of occurrence is assigned a code having the highest number of digits; calculating a group dimension index by multiplying the value of frequency of occurrence of a particular sub data string with the number of digits in the code that is assigned to the particular sub data string and by adding the products of the said multiplications; repeating the process of calculating to obtain different group dimension indices by changing the number of digits in the sub data string and changing the starting digit of separation within the main data string; repeating the process of changing the number of digits in sub data string within a range and shifting the start digit in main data string until all the possible starting digits are covered; selecting the group of sub data strings having the smallest value of group dimension index; placing the codes of the group of sub data strings with the smallest value of group dimension index into a multi-dimensional matrix, wherein the first code with the lowest number of digits is preferably but not necessarily placed in the beginning point in the multi-dimensional space and other codes are placed so that all or part of the previously embedded codes are used to construct the subsequent codes.

An object of the invention is to create a data compression and decompression method that provides faster and more efficient data compression than existing methods, especially when used in a computer system, in a communication system or in an electronic system.

Another object of the invention is to provide a method that can accomplish data compression in two levels, one when codes are assigned to sub data strings and another further data compression when codes are placed in multi-dimensional matrix. To accomplish this object a data string that is represented with any numerical system can be grouped into different sub data strings with different lengths. The frequencies of occurrences of these sub data strings in the main data string are determined. An identification code is assigned to each sub data string, where, the sub data string having the highest frequency of occurrence in the main data string is allocated the code having the lowest possible number of digits; subsequently allocating the next shortest code to the sub data string having the second highest frequency of occurrence in the main data string and continuing the code allocation by allocating the shortest possible unused code to the sub data string having the next highest frequency of occurrence in the main data string, until all the possible sub data strings are exhausted. For example, if a first sub data string with a frequency of occurrence is assigned a first identification code, a second sub data string with a lower frequency of occurrence than the first sub data string is assigned a second shortest identification code which is in equal length or longer than the first identification code. Subsequently, sub data strings with higher frequency of occurrence use shorter identification codes resulting in a first compression. The key and the main difference between the known methods and this method is that, while the other methods employ the standard Huffman method of compression coding, this method dynamically changes the number of digits constituting the sub data strings and starting point of dividing the main data string into sub data strings and finds the optimum combination of sub data string length and starting point of division, by using a test method invented for this method of compression.

Another objective of the invention is to create a second level of data compression by assigning codes to sub data strings and placing these codes into an imaginary multi-dimensional matrix in an order where the codes that are assigned to sub data strings with higher frequency of occurrence are preferably but not necessarily placed at a higher location than the codes that are assigned to sub data strings with lower frequency of occurrence. The remaining codes that are assigned to the sub data strings are constructed in the same imaginary matrix by sharing part or whole of the previously placed codes. This allows an entire or part of a code string to be used to construct more than one code thus reducing the size of the compressed file. Consequently, a second compression is accomplished. This method of placement of codes that are assigned to sub data strings in an imaginary multi-dimensional matrix differs from known methods in that codes in sub data strings are placed based on their features and their occurrence in a main data string and as one moves away from the beginning point in the imaginary multi-dimensional matrix the code for each sub data string becomes longer and larger.

Another objective of the invention is to produce a computer program that can be stored in a processing unit and cause the processing unit to perform actions for performing data compression and decompression. This way, as the computer program becomes a standard part of the processing unit, the data compression and decompression process is standardized and can be repeated on data applied to the processing unit.

Another objective of the invention is to create a data compression and decompression method that can be used to compress data that is either not compressed at all or previously compressed, using existing data compression techniques. The data may be compressed using existing data compression methods either with or without loss of original information. The method disclosed and claimed in this application provides an efficient data compression at high processing speeds.

BRIEF DESCRIPTION OF DRAWING

FIG. 3A shows main data string 6 and sub data string.

FIG. 3B shows how main data string is divided into sub data strings in two different ways;

FIG. 3C shows sub data strings having 3 and 4 digit lengths respectively;

FIG. 3D shows sub data strings having 3 and 4 digit lengths respectively;

FIG. 3E shows sub data strings having 3 and 4 digit lengths respectively.

REFERENCE NUMBERS USED IN DESCRIPTION AND FIGURES

Figure 1:
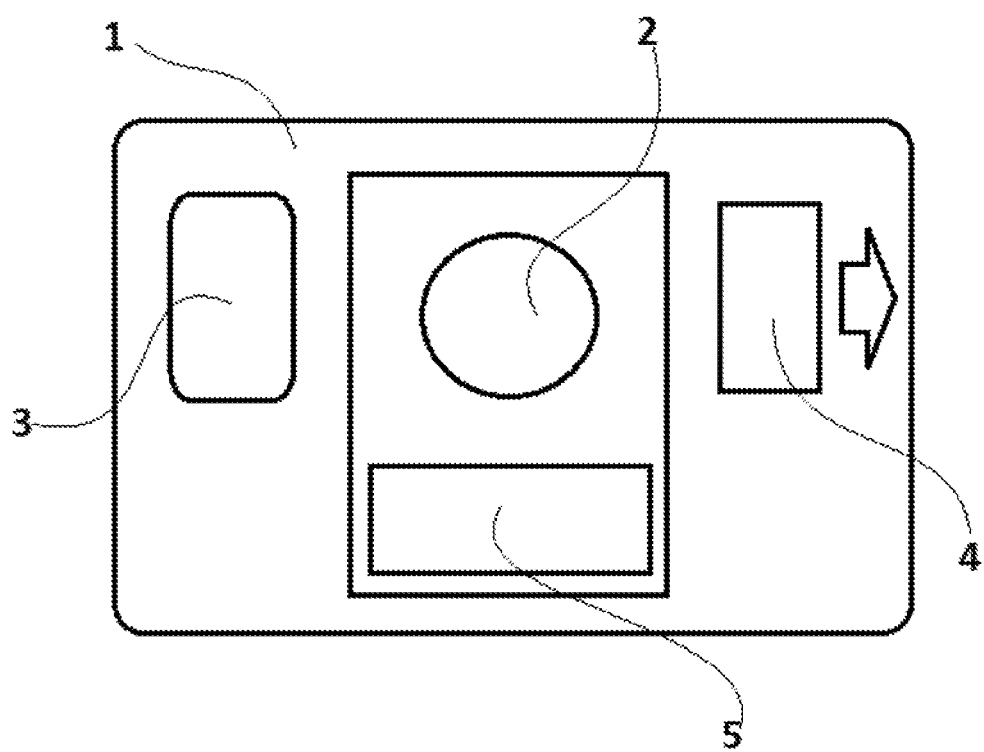
FIG. 1 shows an electronic system where the method is used.

8—Data processing system
9—Processor
10—Storage unit
11—Output unit
17—Software system
13—Main data string
14—Sub data string
n—Number of data in the main data string
m—Number of data in the sub data string
g—Group dimension index

DETAILED DESCRIPTION

The data compression and decompression method disclosed and claimed in this application can be applied to any input data that uses any numerical system. The method will be described as being applied to a data string that is represented using a binary numerical system. However, this should not be considered as a limitation of the method as the method can be used on any data that uses any numerical system.

Assuming data to be compressed uses a binary numerical system the method achieves data compression by dividing the main data string into a multitude of sub data strings. The frequency of occurrences of these sub data strings in the main data string are counted. These frequency of occurrences are determined and sub data strings are listed in an order wherein the code of the sub data string with the highest frequency of occurrences is placed at the top of listing, and others are placed below the sub data string in a descending order of frequency of occurrence. After this placement based on the frequency of occurrence in the main data string, each sub data string is assigned a code wherein the sub data string with the highest frequency of occurrence is allocated the shortest possible code and the sub data string having the next highest frequency of occurrence is again allocated the shortest possible code other than those codes which are already allocated. This process is continued until every individual sub data string is allocated a code. Following this code allocation, the frequency of occurrence of each sub data string is multiplied by the number of digits of the code that is allocated to that sub data string and the products of these multiplications are added to generate the group dimension index for the chosen sub data string and starting point combination. The above elaborated procedure is repeated for various sub data string sizes and starting points. Each of these operations yield a specific group dimension index and the sub data string and starting point yielding the lowest group dimension index is chosen as the working combination.

Subsequently, the codes of the working combination are inserted into a multidimensional (preferably three dimensional) imaginary matrix in a way to provide further data compression. Insertion starts at any chosen point. In the example below, the matrix is a tetrahedron. Its apex is a single point. Thus the apex can accommodate the shortest code which most probably has one digit. Therefore the insertion of the codes is started from the apex, but starting at the apex is not required as it has no direct effect in increasing the compression efficiency. The following codes are placed adjacent to the previously placed codes so that they can share some digits, but not always underneath the previous one. The codes are placed anywhere adjacent to the previously placed code that allows maximum digit sharing.

The length of the code with maximum number of digits depends on the number of different sub data strings. While coding, one starts with the sub data string having the highest frequency and preferably but not necessarily gives it the shortest code that one can give. Then one moves to the next most frequent string and gives it the next shortest code after the one he has already given and this process goes on until all different sub data strings are allocated a code. If the variety of the sub data strings is not too numerous, number of codes shall be small and consequently, the longest code shall also be short.

Codes that represent sub data strings are placed in an imaginary multi-dimensional matrix, in a way to provide further data compression. Codes are placed in a multiple dimensional (preferably three dimensional) matrix such that one or more digits of the code are shared with a part or whole of another code. To implement this method, a computer system (hardware), a software program, and an electronic system with an embedded program are required. The method can be implemented by using a computer, a network of computers, an electronic device, a communication system, digital broadcast equipment, or any other relevant device not mentioned here. The method provides a data compression that reduces the amount of data required to represent an original set of data. This result helps to make data storage or data transfer more efficient by reducing the number of calculations and reducing the storage requirements, since less data means less storage area in a computer system.

The method is described as being used on a computer system. It is important to note that the disclosed and claimed method can be used in different electronic systems either an electronic system alone or electronic systems connected by a network or any other method of data transfer to other electronic equipment.

FIG. 1 shows data processing system 1 which can be located in a computer, in an electronic device, in a communication system, i.e. a system that can store, process, send and receive information. Data processing system 1 can be a stand-alone computer, an embedded system, a network system or any other relevant system. Data processing system 1 comprises at least one processor unit 2, at least one storage unit 3, unit 4, and software system 5. These units are minimum requirements to implement the disclosed and claimed data compression method. Data processing 1 comprises a processor unit 2 which can be a central processing unit (CPU) or a similar processor. Storage unit 3 is used to store the software and the raw data before compression or decompression and also is used to store data strings that are obtained before the process starts, dining the process and when the process is finished. Processor unit 2 processes the raw data stored in storage unit 3 based on the method algorithm in software system 5. Output unit 4 sends the resulting compressed data to other units such as printer, data transfer center, another storage unit, a display device, or any environment that is outside the data processing system 1.

FIG. 1 shows data processing system 1 having the minimum required elements for the data compression algorithm to work properly, namely, a processor, a storage unit, a software component and an output unit. The method can be implemented on different platforms having different units.

Data processing system 1 uses the main data string in storage unit 3. Processor unit 2 under the control of software algorithm 5 compresses the main data string and sends the resulting compressed data to output unit 4 to be shared with outside units.

The method will be described using a main data string that is built by using a binary numerical system. While the method can be used to compress and decompress any main data string based on any numerical system, using a binary system makes the method easier to explain and understand. The main data string that is made of binary numerical system is divided into sub data strings.

Figure 2:
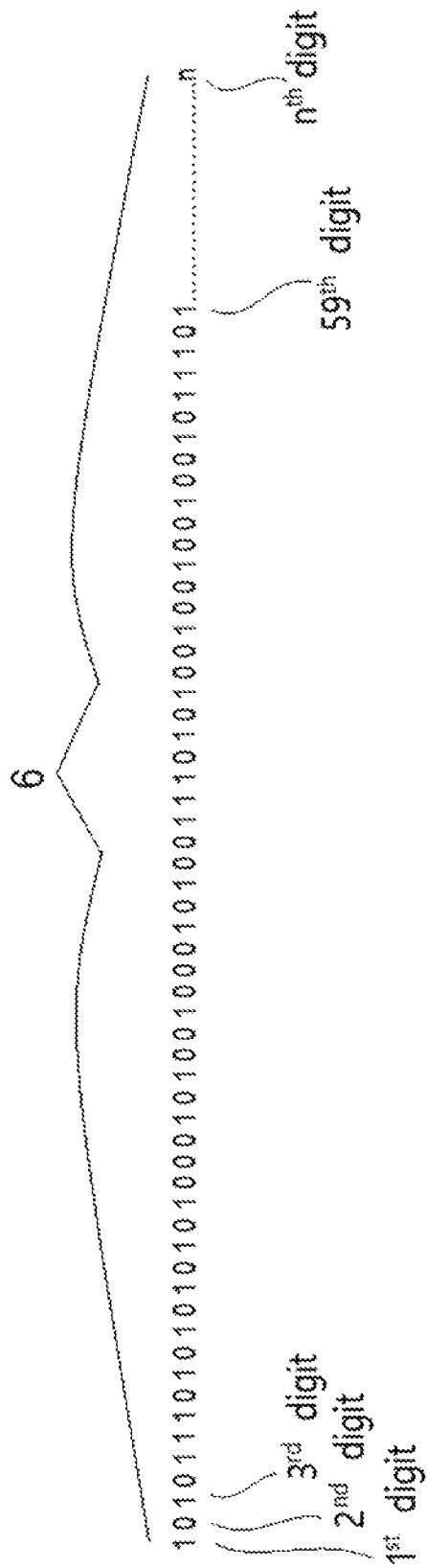
FIG. 2 shows binary data, which represents raw data string.

FIG. 2 shows raw main data string 6, which is based on a binary numerical system. Main data string 6 comprises individual bits, in a binary system, a bit represents one digit. Main data string 6 in FIG. 2 may have "n" number of bits, which means main data string 6 may have "n" digits.

FIGS. 3A, 3B, 3C, 3D, and 3E show how main data string 6 is divided into sub data strings 7. Each sub data string 7 has "m" digits where in represents the number of digits of the sub data string. During the process, the number "m" is varied within a predetermined range until the optimum value of "m" is found. In FIGS. 3A, 3B, 3C, 3D, and 3E, the number of digits is "m" which is either determined by the software program or by a user and it can be a single number or a range of members.

Figures 3A, 3B, 3C, 3D, 3E:
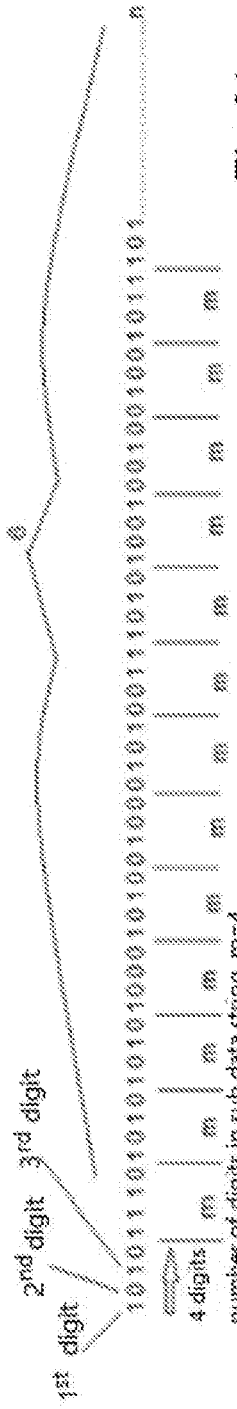
FIGS. 3A, 3B, 3C, 3D, and 3E shows an example of generating sub data strings.

One starts by stating the number of digits in the main data string. In FIG. 2 the main data string has 59 digits. The number "59" is arbitrarily selected for this example; however, main data string 6 may have any number of digits. In the first step of data compression method, main data string 6 is divided into sub data strings 7 as described in detail below. FIG. 3A shows sub data string 7 having 4 digits.

Therefore in FIGS. 3A, 3B, 3C, 3D, and 3E, each sub data string 7 has digit length "m" which is 4. There is no limit to the number of digits for sub data string 7. Any number of digits can be used as long as a computer performs the process. Therefore the number of digits "m" in sub data string 7 can be changed until the optimum digit number "m" can be obtained by using the method. The number of digits "m" in sub data string 7 cannot be larger than the number of digits in main data string 6. There is a combination of an optimum number for the number of digits "m" and starting point of division for sub data string 6 within the main data string 7. This optimum number and starting point of division are obtained as described below: In the first step, main data string 6 is divided into sub data strings 7 each having the digit length "m". In the second step, sub data strings 7 in main data string 6 are counted and the frequency of occurrence for each different sub data string 7 in main data string 6 is determined. After the determination of the frequency of occurrence of each different sub data string 7 in main data string 6, these sub data strings are each given a code with the highest frequency sub data string 6 being allocated the code with lowest possible number of digits, the sub data stream having the next highest frequency of occurrence being allocated the next smallest possible number of digits and continuing this allocation until all the sub data streams 6 are allocated a code. In the subsequent step, the frequency of occurrence of each sub data string is multiplied by the number of the digits of the codes that are allocated to them. The sum of the products of the afore mentioned multiplications is recorded as the group dimension index for this number of digits "m" and this division starting point. Once the group dimension index for sub data strings 7 are determined for a certain number of digits "m" of sub data string 6 for every possible starting point of division, the number of digits "m", forming sub data string 7 is changed within the predetermined range and the group dimension indices for each new sub data string 7 having a different starting digit in main data string 6 is determined and recorded. While the sub data string 7 is being shifted within main data string 6, first the number of digits in sub data string 7 is kept constant and the shifting is performed and after each shifting, new frequencies of occurrences of the new sub data strings 7 in main data string 6 are calculated. After this shifting operation, the number of digits in sub data string 7 is changed and the shifting operation is repeated. Main data string 6 is divided into different sub data strings 7 by changing the number of digits in sub data string 7 and the digit where the sub data string 7 starts in main data string 6. This change is done systematically to determine the group dimension index for each sub data string 7 in main data string 6, with different sub data lengths and all possible starting points of division of the main data string, the sub string number of digits "m" and starting point of division is chosen as the working sub data string length and starting point of division combination. This process yields the optimum number of digits for sub data string 7 and the digit of main data string 6 where division of the main data string to sub data strings 7 starts. The process of changing the number of digits in sub data string 7, is followed by shifting sub data string 7 within main data string 6 and is further followed by calculation of the frequency of occurrence of sub data string 7 in main data string 6; the operation is repeated until different combinations of the number of digits of sub data string 7 and different digit positions of sub data string 6 are used and as a result different frequency of occurrences of sub data strings 7 are determined.

FIG. 3A shows main data string 6 and sub data string 7. FIG. 3B shows how main data string 6 is divided into sub data strings 7 in two different ways. In the first case each sub data string 7 has 3 digits and in the second case each sub data string 7 has 4 digits. Given the length of the digit for each sub data string 7, main data string 6 is divided into different sub data strings 7 starting from the initial digit of the main data string (marked as digit number 1 in FIG. 3A). FIG. 3C shows sub data strings 7 having 3 and 4 digit lengths respectively. Main data string 6 is divided into sub data strings 7 by starting from the digit number 2 of the main data string 6. FIG. 3D shows sub data strings 7 having 3 and 4 digit lengths respectively. Main data string 6 is divided into sub data strings 7 by starting from the digit number 3 of the main data string 6. FIG. 3E shows sub data strings 7 having 3 and 4 digit lengths respectively. Main data string 6 is divided into sub data strings 7 by starting from the digit number 4 of the main data string 6. After this division as shown in FIGS. 3B, 3C, 3D, and 3E frequency of occurrence of each sub data string 7 in main data string 6 is calculated. FIGS. 3A, 3B, 3C, 3D, and 3E show how main data string 6 is divided in different sub data strings 7 by using different digit lengths of sub data strings 7 and by starting from a different digit position within main data string 6. In FIGS. 3A, 3B, 3C, 3D, and 3E, sub data strings 7 are formed by using 3 and 4 digits. The number of digits can be changed as needed to obtain many different frequencies of occurrences of sub data strings 7 in main data string 6. In this embodiment, sub data string 7 length is selected as either 3 or 4. Numbers 1 and 2 are not selected because selecting digit lengths 1 and 2 does not generate any compression.

Generally speaking sub data strings 7 are formed using different digit lengths and starting from the first digit of main data string 6, then counting frequency of occurrence for each sub data string 7. After the frequency of occurrence is calculated, new sub data strings. 7 are generated by shifting the starting point one digit to right or left of the previous starting digit of main data string 6. A new set of sub data strings 7 are generated this way. Frequencies of occurrences of sub data strings 7 in main data string 6 are re-calculated. Next, new sub data strings 7 are generated by shifting the starting point one digit forward or backward from the previous starting digit of main data string 7 and frequency of occurrences of sub data strings 7 in main data string 6 are re-calculated. Once the shifting operation is concluded, the digit length of each sub data string 7 is changed and the shifting operation is repeated for each digit length of sub data string 7 until all the possible starting points are covered and for each possible case in main data string 6 are calculated.

Table 1 shows the frequency of occurrences of each sub data string 7 as shown in FIGS. 3A, 3B, 3C, 3D, and 3E. Table 1 shows sub data strings 7 with 4 digits and all of these sub data strings 7 are generated by starting from the first digit of main data string 6 and shifting one forward. Thus, as shown in Table 1 a multitude of sub data strings 7 are generated and a multitude of frequencies of occurrences of each sub data string 7 in main data string 6 are calculated.

TABLE 1

List of frequency of occurrences for sub data strings 7 using 4 digits

| Sub data string | Frequency of Occurrence |
|---|---|
| 1 0 1 1 | 200 |

TABLE 1-continued

List of frequency of occurrences for
sub data strings 7 using 4 digits

| Sub data string | Frequency of Occurrence |
|---|---|
| 1 0 1 0 | 180 |
| 1 1 0 1 | 120 |
| 1 0 0 1 | 40 |
| 1 1 0 1 | 20 |
| ... | ... |

As discussed above, sub data strings 7 are generated by using different number of digits and shifting one digit position in main data string 6. Therefore shifting, calculating frequency of occurrence, shifting again, and calculating frequency of occurrence steps are repeated for sub data strings 7 using certain number of digits. Once this operation is performed on main data string 6, the digit length of sub data string 7 is increased by one and the shifting and frequency calculation operation is repeated. This operation is repeated until sub data string 7 digit length reaches a predetermined maximum digit length. While this process is being repeated to find different frequency of occurrences for each sub data string 7, the group dimension index "g" which is an important parameter in this method) is calculated by first multiplying each frequency of occurrence of sub data string 7 in main data string 6 by the number of digits used in the code assigned to sub data string 7 for that frequency of occurrence and then adding all the results of multiplications together. It can be summarized in a mathematical formula as:

$g = \Sigma$ frequency of occurrence $X$ number of digits in the code assigned to sub data string for this frequency of occurrence.

The combination that has the lowest group dimension index "g" is selected and then the codes assigned to sub data strings 7 are placed in a multi-dimension matrix. While calculating the group dimension index 'g', the frequency of occurrence of each sub data string is listed from the largest to the smallest. The sub data string 7 with the highest frequency of occurrence is assigned a code with the lowest number of digits. Sub data string 7 with lower frequency of occurrence is assigned a code with higher number of digits. The process continues this way until all sub data strings 7 are assigned a code in a way that the code digit length increases as the frequency of occurrence of sub data string 7 in main data string 6 decreases.

This process is demonstrated in the following example:

Table 2a shows frequencies of occurrences of sub data strings 7 using 2 digits (m=2) and starting from a given digit of k in main data string 6. Table 3a shows frequency of occurrences of sub data strings 7 using 2 digits (m=2) and starting from k+1 digit in main data string 6.

TABLE 2a m = 2 frequencies of occurrences for each sub data string
7 starting from a given digit (k) in main data string 6.

| Sub data string | Frequency of Occurrence |
|---|---|
| 00 | 18546 |
| 01 | 9557 |
| 10 | 16154 |
| 11 | 5056 |

TABLE 3a m = 2 frequency of occurrence for each sub data string 7 starting
from the digit of (k + 1) in main data string 6.

| Sub data string | Frequency of Occurrence |
|---|---|
| 00 | 3384 |
| 01 | 15234 |
| 10 | 17765 |
| 11 | 13039 |

Table 4a shows frequency of occurrences of sub data strings 7 using 3 digits (m=3) and starting from a given digit of (k) in main data string 6.

Table 5a shows frequency of occurrences of sub data strings 7 using 3 digits (m=3) and starting from the digit of (k+1) in main data string 6.

Table 6a shows frequency of occurrences of sub data strings 7 using 3 digits (m=3) and starting from the digit of (k+2) in main data string 6.

TABLE 4a m = 3 frequency of occurrence for each sub data string
7 starting from a given digit (k) in main data string 6.

| Sub data string | Frequency of Occurrence |
|---|---|
| 000 | 1270 |
| 001 | 9280 |
| 010 | 120 |
| 011 | 678 |
| 100 | 3291 |
| 101 | 11543 |
| 110 | 4332 |
| 111 | 2434 |

TABLE 5a m = 3 frequency of occurrence for each sub data string 7
starting from digit (k + 1) in main data string 6.

| Sub data string | Frequency of Occurrence |
|---|---|
| 000 | 6653 |
| 001 | 3259 |
| 010 | 5476 |
| 011 | 238 |
| 100 | 3765 |
| 101 | 4365 |
| 110 | 6432 |
| 111 | 2760 |

TABLE 6a m = 3 frequency of occurrence for each sub data string 7
starting from digit (k + 2) in main data string 6.

| Sub data string | Frequency of Occurrence |
|---|---|
| 000 | 675 |
| 001 | 4433 |
| 010 | 4634 |
| 011 | 9658 |
| 100 | 1265 |
| 101 | 3246 |
| 110 | 7649 |
| 111 | 1388 |

As shown and described above in Table 2a through Table 6a, by using different digit lengths and starting from a different starting digit in main data string 6, different sub data strings 7 are obtained and different frequencies of occurrences of sub data strings are calculated. Sub data strings 7 with the highest frequency of occurrence is assigned a code with a single digit (for example "0"), and sub data string 7 with the next closest and lower frequency of occurrence is assigned a code that is one digit longer than the code assigned to sub data string 7 with the highest frequency of occurrence (in this case another code with one digit can be assigned namely the code "1"). As the frequency of occurrence of each sub data string 7 decreases, those sub data strings are assigned codes with higher number of digits. Frequency of occurrence of each sub data string 7 is multiplied with the number of digits in the code assigned to that corresponding sub data string 7. For each starting point digit in main data string 6 and for each length of sub data string "m" combination, the results of these multiplications are added to find the group dimension index "g". It is important to emphasize that group dimension index "g" is obtained for each starting digit in main data string 6 and for each sub data string digit number 'm'. The sub data string 7 group that is obtained by using certain number of digits and starting from certain digit of main data string 6 with the lowest group dimension index 'g" is selected as the working combination. This combination is determined to be the combination that provides the best compression at this point of the process. Shifting the starting digit and changing the number of digits in sub data string 7 is continued until all the sub data string lengths (in) in the chosen range and all the possible starting points of division are covered. The sub data digit number (m) and starting digit in the main data string 6 that give the lowest group dimension index (g) are all used for data compression.

Using, the example we discussed in Tables 2a through 6a above.

Table 2b shows the situation where sub data string 7 has two digits, starts at digit "k" in main data string 6, frequency of occurrences are calculated, codes are assigned to sub data strings and product of the frequencies of occurrence of the sub data strings and the number of digits of the codes allocated to these sub data strings are calculated. The group dimension index is calculated by adding the said products calculated for each sub data string 7.

TABLE 2b

Group dimension index calculation for sub data strings with m = 2 and starting from a given digit (k) in main data string 6

| Sub data string | Frequency of Occurrence | Code | Digit | Product |
|---|---|---|---|---|
| 00 | 18546 | 0 | 1 | 18546 |
| 10 | 16154 | 1 | 1 | 16154 |
| 01 | 9657 | 10 | 2 | 19314 |
| 11 | 5065 | 11 | 2 | 10130 |
| Total (group dimension index) | | | | 64144 |

Table 3b shows the situation where sub data string 7 has two digits, starts at digit "k+1" in main data string 6, frequency of occurrences are calculated, codes are assigned to sub data strings and group dimension indices for each sub data string is calculated. The total group dimension index is calculated by adding the group dimension indicies calculated for each sub data string 7.

TABLE 3b

Group dimension index calculation for sub data strings with m = 2 and starting from digit (k + 1) in main data string 6.

| Sub data string | Frequency of Occurrence | Code | Digit | Product |
|---|---|---|---|---|
| 10 | 17765 | 0 | 1 | 17765 |
| 01 | 15234 | 1 | 1 | 15234 |
| 11 | 13039 | 10 | 2 | 26078 |
| 00 | 3384 | 11 | 2 | 6768 |
| Total (group dimension index) | | | | 65845 |

Table 4b shows the situation where sub data string 7 has three digits, starts at digit "k" in main data string 6, frequency of occurrences are calculated, codes are assigned to sub data strings, and product of frequencies of occurrences and number of digits of the codes allocated for each sub data string is calculated. The total group dimension index is calculated by adding the group dimension indicies calculated for each sub data string 7 for this sub data string 7 and starting point of division combination is calculated by summing these products.

TABLE 4b

Group dimension index calculation for sub data strings with m = 3 and starting from digit (k) in main data string 6.

| Sub data string | Frequency of Occurrence | Code | Digit | Product |
|---|---|---|---|---|
| 101 | 11543 | 0 | 1 | 11543 |
| 001 | 9580 | 1 | 1 | 9280 |
| 110 | 4332 | 10 | 2 | 8664 |
| 100 | 3291 | 11 | 2 | 6482 |
| 111 | 2434 | 100 | 3 | 7302 |
| 000 | 1270 | 101 | 3 | 3810 |
| 011 | 678 | 110 | 3 | 2034 |
| 010 | 120 | 111 | 3 | 360 |
| Total (group dimension index) | | | | 49575 |

Table 5b shows the situation where sub data string 7 has three digits, starts at digit "k+1" of main data string 6, frequency of occurrences are calculated, codes are assigned to sub data strings, and product of frequencies of occurrences and number of digits of the codes allocated for each sub data string is calculated. The total group dimension index for this sub data string length 7 and starting point of division combination is calculated by summing these products.

TABLE 5b

Group dimension index calculation for sub data strings with m = 3 and starting from digit (k + 1) in main data string 6

| Sub data string | Frequency of Occurrence | Code | Digit | Product |
|---|---|---|---|---|
| 000 | 6653 | 0 | 1 | 6653 |
| 110 | 6432 | 1 | 1 | 6432 |
| 010 | 5476 | 10 | 2 | 10952 |
| 101 | 4365 | 11 | 2 | 8730 |
| 100 | 3765 | 100 | 3 | 11295 |
| 001 | 3259 | 101 | 3 | 9777 |
| 111 | 2760 | 110 | 3 | 8280 |
| 011 | 238 | 111 | 3 | 714 |
| Total (group dimension index) | | | | 62833 |

Table 6b shows the situation where sub data string 7 has three digits, starts at digit "k+2" of main data string 6, frequency of occurrences are calculated, codes are assigned to sub data strings, and product of frequencies of occurrences and number of digits of the codes allocated for each sub data string is calculated. The total group dimension index for this sub data string 7 and starting point of division combination is calculated by summing these products.

TABLE 6b

Group dimension index calculation for sub data strings with m = 3 and starting from digit (k + 2) in main data string 6

| Sub data string | Frequency of Occurrence | Code | Digit | Product |
|---|---|---|---|---|
| 011 | 9658 | 0 | 1 | 9658 |
| 110 | 7649 | 1 | 1 | 7649 |
| 010 | 4634 | 10 | 2 | 9268 |
| 001 | 4433 | 11 | 2 | 8866 |
| 101 | 3246 | 100 | 3 | 9738 |
| 111 | 1388 | 101 | 3 | 4164 |
| 100 | 1265 | 110 | 3 | 3795 |
| 000 | 675 | 111 | 3 | 2025 |
| Total (group dimension index) | | | | 55163 |

Data in Table 2b through Table 6b shows that the lowest group dimension index "g" is 49,575 as shown in Table 4b. Therefore sub data strings with m=2 and starting from digit (k) in main data string 6 are used in this combination are used for the following process.

To summarize the process thus far, main data string 6 is divided into sub data strings 7. Group dimension indices "$g_i$" are calculated for these sub data strings 7. This calculation is repeated by changing the number of digits (m) of the sub data strings 7 and shifting the location of starting digit of division in main data string and finally the lowest group dimension index "g" is found. The combination of the number of digits in sub data strings 7, namely "m" and the starting digit in main data string 6, are used as the basis for the following process.

Subsequently, codes that are assigned to sub data strings 7 are placed in a multi-dimensional matrix. The first code that is assigned to sub data string 7 with the highest frequency of occurrence is placed in a convenient location in the multi-dimensional matrix. Other codes are placed to the vicinity of the first code.

Codes are placed in a multi-dimensional matrix not by re-writing them but instead if a code is included in another code or if part of a code is included in another code that is surrounding it, then these reoccurring parts are superimposed. In one embodiment, a tetrahedron is used to place codes in a three dimensional matrix. The code that is assigned to sub data string 7 with the highest frequency of occurrence is called the first code and is assigned the shortest possible code, possibly with a single digit, either "0" or "1". While it is common that the first code has a single digit, the first code may have a different number of digits. The first code is placed at a convenient spot, possibly in the apex of the triangular pyramid in three-dimensional matrix. The next code that is assigned to sub data string 7 with the second highest frequency of occurrence is called the second code and the second code may have another single digit code ("1") or any other digit. The second code can be placed below the first code in the three dimensional matrix. As the number of digits in the codes increases, instead of writing the new codes at separate locations, they are reconstructed by using the digits of the preciously inserted codes and their position is defined by positioning vectors. For example, if the first code is "0" and the second code is "1", then a code with two digits (for example code "10") can be represented as a vector to state that the code is the combination of the second code and the first codes. Therefore the vector will be defined as "the second code that is located in the second level of the triangular pyramid and the first code that is located just above the second code." Thus, all the codes are represented by using vectors that utilize previous codes. This way, the main data string can be represented by a much shorter data string. By using vector representation for the codes assigned to sub data strings 7, additional compression is accomplished. This additional compression is in addition to the compression obtained by choosing the smallest group dimension index as described above.

Figure 4:
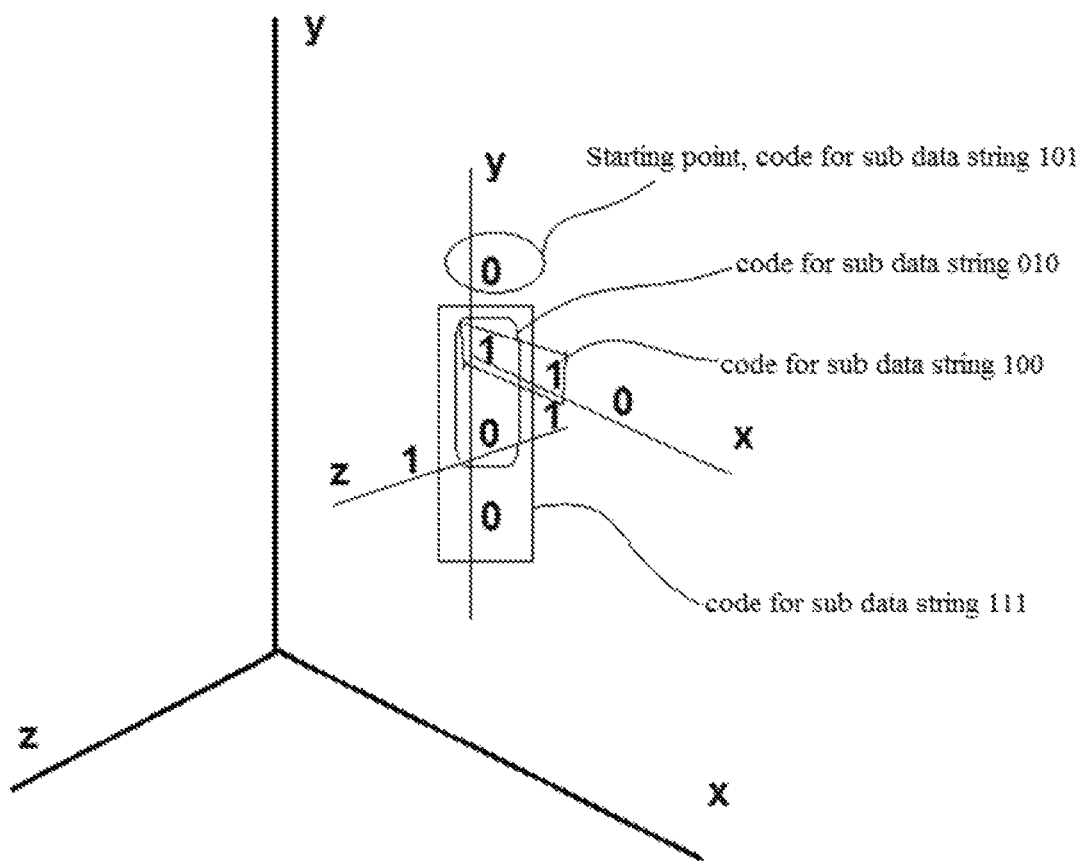
FIG. 4 shows placement of sub data strings in three-dimensional matrix.

FIG. 4 shows the three-dimensional matrix and how codes are placed in the three dimensional matrix by using vector representation. While FIG. 4 shows a three dimensional matrix, that should not be considered as a limitation. The number of dimensions for the matrix can be any number. Table 4b has the lowest group dimension index (49,575) and in this combination, sub data string "101" has the highest frequency of occurrence (11,543). In this case sub data string "101" is assigned the code "0". This first code "0" is placed the beginning point in the three-dimensional matrix as shown in FIG. 4. The next most frequent sub data string "001" is assigned the second code "1" as shown in Table 4b. The second code "1" is placed just below the first code "0" in the "−y" direction as shown in FIG. 4. Next most frequent, sub data string "110" is assigned the third code "10" as shown in Table 4b. The third code "10" can be placed below the second code in the "−y" direction in the three-dimensional matrix as shown in FIG. 4. However it is not necessary to use "10" for the third code. Instead, it can be defined as "read in +y direction starting from y=−1 position. Likewise, the next sub data string "100" is assigned the fourth code "11". The fourth code "11" is placed next to the second code in the "x" direction and shares the digit "1" with the second code "1". The sub data string "111" is assigned the fifth code "100" in Table 4b. The fifth code is placed in the three dimensional matrix just below the third code in the "−y" direction. It is enough to add digits "00" to create the code "100". This way the digit "1" from the second code "1" is used. By following this process, a plurality of codes assigned to a plurality of sub data strings are placed in multidimensional matrix to provide additional compression. This example should not be considered limiting on this invention. The example is given to describe the invention. While this example uses three-dimensional matrix, it is possible to use multi-dimensional matrix. By using this method, it is not necessary to use all the digits in code to place them in a multi-dimensional matrix, instead codes that use common digits are placed next to each other to share those common digits. This scheme provides a further compression.

Figure 5:
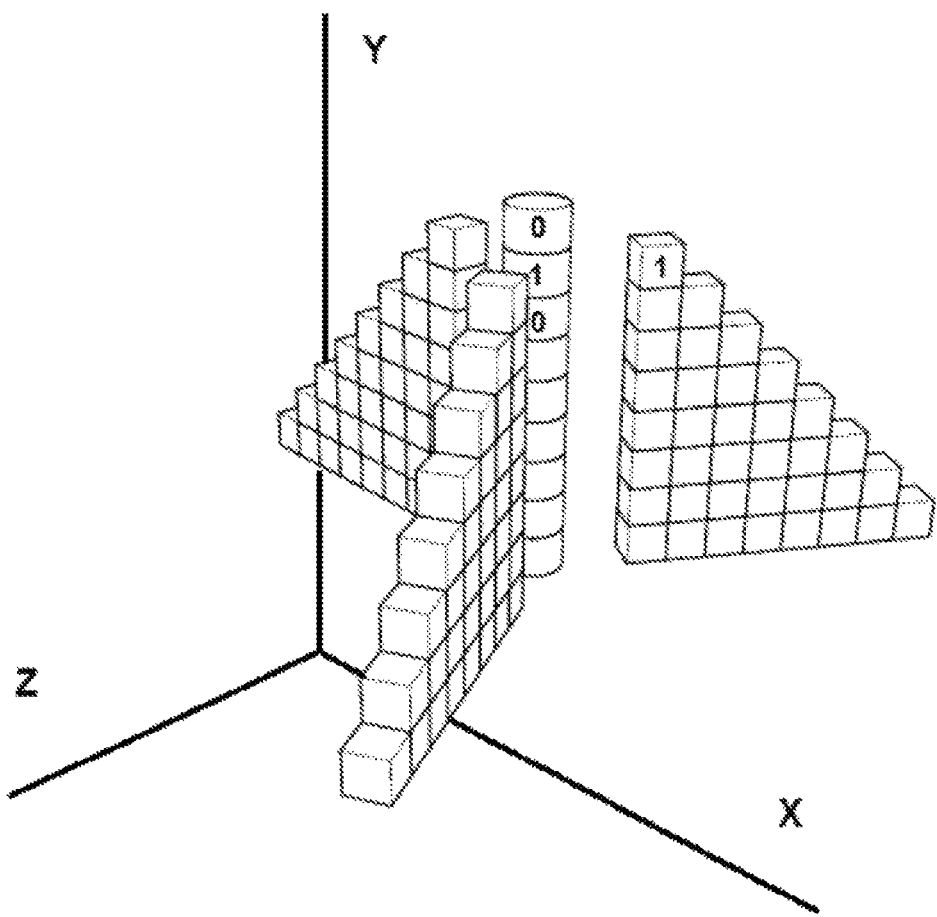
FIG. 5 shows geometrical placement of sub data strings in three-dimensional matrix in geometry.

FIG. 5 shows an example three-dimensional matrix and how codes are placed in this three dimensional matrix in a geometrical way. The geometry in FIG. 5 remains as a triangular pyramid however this should not be considered a limiting geometry and any shape is possible as long as codes are placed in a given multidimensional matrix as described above by sharing commonly used digits to provide additional data compression.

Figure 6:
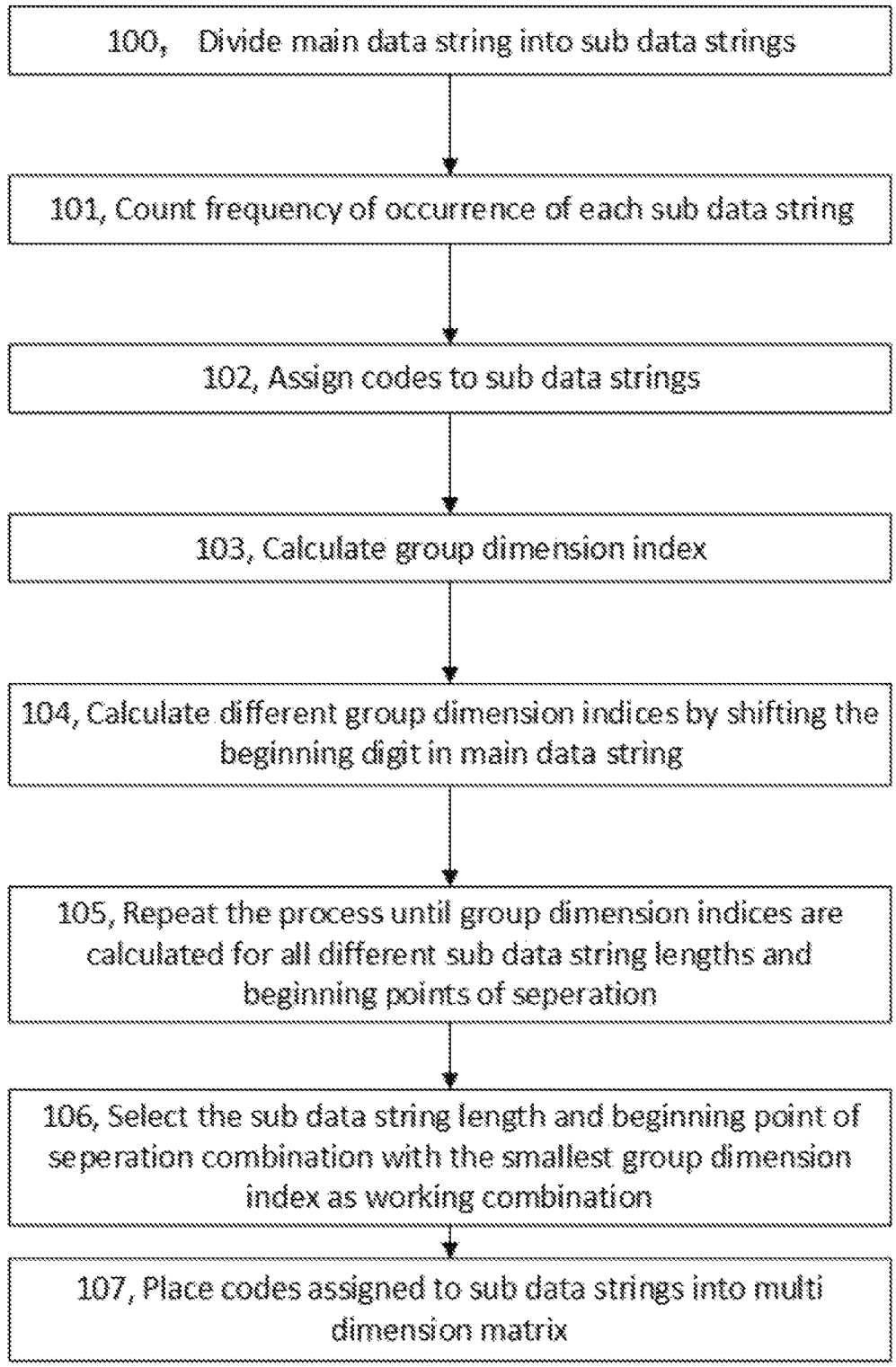
FIG. 6 shows a flow chart of data compression algorithm.

The process can be described below:

Referring to FIG. 6, different steps of the data compression algorithm are described. In step 100, main data string 6, which is represented by using a binary numerical system, is divided into sub data strings 7.

In step 101, frequency of occurrence of sub data strings in main data strings are calculated.

In step 102, codes are assigned to sub data strings 7 based on their frequency of occurrences in main data string 6. Code assignment is made based on the following criteria: the sub data string with the highest frequency of occurrence is assigned the code with the least number of digits. The sub data string with the lowest frequency of occurrence is assigned a code with the most number of digits.

In step 103, group dimension indicies are calculated by multiplying the value of the frequency of occurrence by the number of digits used in the code assigned to the sub data string corresponding to the frequency of occurrences for that sub data string.

In step 104, different group indexes are calculated by changing the digit numbers in sub data strings and by changing the starting digit within the main data string.

In step 105, the process of step 104 is repeated until the group dimension index value does not decrease any longer or starts increasing. When the group dimension index value either stops decreasing or stays the same or starts increasing then the process in step 104 is stopped.

In step 106, the group with the smallest group dimension index is selected.

In step 107, the codes that are assigned to sub data strings within the group with the smallest group dimension index are placed in a multi-dimensional matrix. Using a three dimensional matrix as an example here, the placement of codes in a three-dimensional matrix is accomplished in the following manner: the first code having the shortest number of digits (compared to other codes in the selected group of sub data strings) is placed in a starting point in the three-dimensional matrix. The second code having a higher number of digits than the first code (or the same number of digits depending upon the code assignment, for example the first code may be "0" and the second code may be "1") is placed next to the first code on one of the three dimensional axis in the three dimensional matrix. The third code having higher number of digits than the first code and the second code is placed close to either the first code or the second code so that common digits between them can be shared. This sharing process provides the second level of compression. All the codes in the selected group of sub data strings are placed in the three dimensional matrix by following this process of sharing common digits with neighboring code. This representation of codes in multi-dimensional matrix is defined as "vector representation" of codes. Therefore codes are placed in three-dimensional matrix by using vector representation. This way a code in a multi-dimensional matrix can be referred to as vectors. For example code "n" can be described as the code placed on x-axis to the right of the code "n−1" and to the bottom of the code "n−4". This is just an example to show how vector representation is used. This example should not be considered as a limitation of this invention. All the codes' locations in multi-dimensional matrix can be defined by using vector representation.

Steps in FIG. 6 can be implemented in an algorithm or a software program; and can be placed in data processing unit 1 so that data compression and decompression can be accomplished on data that is applied to data processing unit 1.

The method can be used in a computer system or an electronic system that includes the following elements: Data processing unit 1, storage unit 3 where main data string 6 is stored therein, at least one processor unit 2, an algorithm that is implemented in software system 5 wherein the algorithm performs the function of data compression and decompression by using the steps of: dividing the main data string into sub data strings, calculating the frequency of occurrence of sub data systems in the main data string, repeating the process of calculating frequency of occurrence by changing the number of digits in sub data string and by changing the starting digit position in main data string, assigning codes to sub data strings based on their frequency occurrence values, calculating group dimension index for each group, selecting the group with the lowest group dimension index and placing codes of the group with the lowest group dimension index in a multi-dimensional matrix wherein the first code with the least number of digits is placed to a top position and other codes with higher number of digits are placed around the first code such that vector placement is utilized to eliminate the need to use digits that are common to neighboring codes, wherein the software system 5 applies this algorithm and method to main data string to compress a raw main data string and decompressed a compressed main data string and output unit 4 sends the compressed and decompressed data to another device.

Data processing unit 1 with the algorithm that implements the method within software system 5 can accomplish this method of data compression of a main data string. The method can be used in a computer, in an electronic device, a data transfer system, communication system or other systems where data compression and decompression is required.

Data decompression is accomplished by performing the steps that are used for data compression in reversed order.

While this method of data compression and decompression can be used as a stand-alone method to compress and decompress data, it can also be combined with other known data compression and decompression techniques.

I claim:

1. A data compression and decompression method that is implemented in a data processing unit the method comprising the steps of:

dividing a main data string into a plurality of sub data strings;

assigning a code for each sub data string therefore having a plurality of codes;

using the plurality of codes to represent the main data string;

wherein the number of digits in the sub data string is set to different values;

wherein the plurality of frequency of occurrences of the sub data strings are determined by counting number of occurrences of the sub data string in the main data string;

wherein a code is assigned to each sub data string within the plurality of sub data systems and the number of digits in the code is determined based on the frequency of occurrence of the data string in the main data string;

wherein a code to a sub data string within the plurality of sub data systems wherein the first sub data string with the highest frequency of occurrence is assigned a code having the least number of digits and a second sub data string having the lowest frequency of occurrence is assigned a code having the same or next smallest number of digits;

wherein different group dimension indices are calculated by changing the number of digits the sub data string and changing the starting digit within the main data string.

2. The data compression method of claim 1, wherein the process of changing the number of digits in sub data string and shifting the start digit in main data string is repeated until the number of digits in the specified range and the possible different starting points for that number of digits is exhausted.

3. The data compression method of claim 2, wherein a group dimension index for each group of sub data strings is calculated by multiplying the value of the frequency of occurrence of a particular sub data string with the number of digits in the code that is assigned to the particular sub data string and by adding the products of these multiplications to calculate the group dimension index for each and every group of sub data strings.

4. The data compression method of claim 3, wherein selecting the group of sub data strings having the smallest value of group dimension index.

5. The data compression method of claim 4, wherein the codes of the group of sub data strings with the smallest value of group dimension index are placed into a multi dimensional matrix.

6. The data compression method of claim 5, wherein the first code with the lowest number of digits is placed in the beginning point in the multi dimensional matrix and other codes are placed around the first code.

7. The data compression method of claim 5, wherein the first code can have any number of digits and the first code is placed any point in the multi dimensional matrix and other codes are placed around the first code.

8. A data compression and decompression method that is implemented in a data processing unit with the method comprising the steps of:
   dividing a main data string into a plurality of sub data strings;
   calculating a plurality of frequency of occurrences for the plurality of sub data strings in the main data string;
   assigning a code to a sub data string within the plurality of sub data systems wherein the sub data string with the highest frequency of occurrence is assigned a code having the least number of digits and a sub data string having the second lowest frequency of occurrence is assigned a code having the next smallest number of digits;
   calculating group dimension index for each group of sub data strings by multiplying the value of frequency of occurrence of a particular sub data string with the number of digits in the code that is assigned to the particular sub data string and by adding the result to find a group dimension index for that group of sub data strings;
   obtaining a different group dimension index by changing the number of digits in the sub data string and changing the starting digit within the main data string;
   repeating the process of changing the number of digits in sub data string and shifting the start digit in main data string until all the possible combinations of number of digits of the sub data strings and starting point of division within the main data string are exhausted;
   selecting the group of sub data strings having the smallest value of group dimension index;
   placing the codes of the group of sub data strings with the smallest value of group dimension index into a multi-dimensional matrix;
   wherein a selected code is placed in any point in the multi-dimensional matrix and other codes are placed around the selected code.

9. A data compression and decompression method that is implemented in a data processing unit the method comprising the steps of:
   dividing a main data string into a plurality of sub data strings;
   assigning a code for each sub data string therefore having a plurality of codes;
   using the plurality of codes to represent the main data string;
   wherein the length of a code assigned to a data string is determined based on the frequency of occurrence of the sub data string within the main data string;
   wherein a first code is assigned to a first data string, a second code is assigned to a second data string, the first data string having a higher frequency of occurrence than the second data string, and the first code having less number of digits than the second code.

* * * * *